(12) United States Patent
Jaffrey

(10) Patent No.: US 6,797,662 B1
(45) Date of Patent: Sep. 28, 2004

(54) ELECTRICALLY CONDUCTIVE CERAMICS

(75) Inventor: Donald Jaffrey, Mount Dandenong (AU)

(73) Assignee: Ceramic Fuel Cells Limited, Noble Park (AU)

(*) Notice: Subject to any disclaimer, the term of this patent is extended or adjusted under 35 U.S.C. 154(b) by 0 days.

(21) Appl. No.: 09/869,544

(22) PCT Filed: Dec. 23, 1999

(86) PCT No.: PCT/AU99/01140
§ 371 (c)(1),
(2), (4) Date: Oct. 15, 2001

(87) PCT Pub. No.: WO00/40520
PCT Pub. Date: Jul. 13, 2000

(30) Foreign Application Priority Data

Dec. 31, 1998 (AU) ............................................. PP7988

(51) Int. Cl.$^7$ ............................................. C04B 35/10
(52) U.S. Cl. .............................. 501/153; 252/62.3 GA; 252/62.3 V
(58) Field of Search ................ 501/153; 252/62.3 GA, 252/62.3 V; 420/520

(56) References Cited

U.S. PATENT DOCUMENTS

| | | | |
|---|---|---|---|
| 3,404,020 A | 10/1968 | Wooley et al. | |
| 3,963,522 A | 6/1976 | Harada et al. | |
| 4,388,347 A | * 6/1983 | Shum et al. | .................. 427/96 |
| 4,880,599 A | 11/1989 | Charles et al. | |
| 5,318,723 A | 6/1994 | Hashemi | |
| 5,753,574 A | 5/1998 | Donaldson et al. | |
| 5,767,029 A | 6/1998 | Schüler | |

FOREIGN PATENT DOCUMENTS

| EP | 0 256 963 A2 | 2/1988 |
|---|---|---|
| JP | 04 138 670 | 5/1992 |
| JP | 4138670 | 5/1992 |

OTHER PUBLICATIONS

Wang L S et al.: Deposition, Structures and Properties of Cement Thin Films Composed of AG and Y–stabilized Zirconia Journal of the electro chemical society New Hampshire U.S. vol. 139 No. 4 Apr. 1, 1992.

Wang, L.S.., et al. "Deposition Structure, and Properties of Cermet Thin Films Composed of AG and Y–Stabilized Zirconia", *Journal of the Electrochemical Society*, Electrochemical Society, Manchester, New Hampshire, U.S., Apr. 1, 1992, 139(4): 1134–1140.

Chemical Abstracts, vol. 117, No. 16, Oct. 19, 1992, abstracts No. 154554e, XP000373253.

(List continued on next page.)

*Primary Examiner*—Arun S. Phasge
(74) *Attorney, Agent, or Firm*—Dorsey & Whitney LLP

(57) ABSTRACT

A metal oxide ceramic material such as alumina or chromia which has been rendered electrically conductive through its thickness by the incorporation of silver into the material. The metal oxide ceramic material may be in the form of a layer on a substrate such as a bipolar plate or other component for a fuel cell assembly. The electrical conductivity may be achieved by heating the ceramic material and a silver-containing material in contact with each other to at least 750° C. such that silver migrates from the silver-containing material the metal oxide ceramic material and creates electrically conductive pathways through the ceramic material. In a particular embodiment, the substrate is a steel which forms an alumina, chromia or alumina-rich or chromia-rich surface layer in oxidizing atmosphere and the silver-containing material is heated in an oxidizing atmosphere in contact with the steel to cause the surface layer to form on the steel and to cause silver from the silver-containing material to occur in and create the electrically conductive pathways through the layer. The silver-containing material may be commercially pure silver or other forms of silver.

17 Claims, 3 Drawing Sheets

OTHER PUBLICATIONS

Derwent Abstract Accession No: 95–085243/12, JP 7–10639 A (Agency of India) Jan.1995.
Derwent Abstract Accession No: 93–097296/12, JP 5–41110 A (Nippon Cement) Feb. 1993.
Derwent Abstract Accession No: 92–386261/47, JP 4–285085 A (Toshiba) Oct. 1992.
Derwent Abstract Accession No: 91–167311/23, JP 3–99487 A (Shinko Denki) Sep. 1989.
Derwent Abstract Accession No: 90–264397/35, JP 2–184555A (Matsushita) Jan. 1989.
Derwent Abstract Accession No: 77–56238y, JP 52–32596A (TDK) Mar. 1977.
Hou et al., "Promises and Problems with Metallic Interconnects for Reduced Temperature Solid Oxide Fuel Cells," Electrochemical Society Proceedings, vol. 99–19: 737748 (1999).

* cited by examiner

ELECTRICALLY CONDUCTIVE CERAMICS

The present invention relates to electrical conductivity in metal oxide ceramic materials and the creation of electrical conductivity in a normally non-conductive material. It has application in providing electrical conductivity across a layer of ceramic material. In a particular application the layer of metal oxide ceramic is adhered to a metal plate and this has special application in components of solid oxide fuel cells.

Alumina is well known as an electrical insulator and as a material which is physically and chemically stable at high temperatures. Its electrical properties are put to good use in many high temperature applications where electrical isolation is desired. However, it would be useful in many applications to have a material which has the high temperature stability of alumina while also having good electrical conductivity. It would be particularly useful if thin layers or sheets of alumina or other metal oxide ceramics could be made electrically conductive through the ceramic in selected locations.

It has now been found in one embodiment that the application of silver metal, in any of a variety of forms, to the surface of a fully dense body of metal oxide ceramic such as alumina or chromia followed by a sustained heat treatment at temperatures in the range 75° C.–97° C. or above, can cause the ceramic to develop electrically conductivity, especially in the immediate vicinity of the silver. Alternatively, the silver may be applied to a surface of a metal substrate on which the fully dense body of metal oxide is caused to form. The conductivity so imparted to the ceramic may be a volume effect, that is, the conductivity may be imparted both laterally and through the thickness of the ceramic body. The body may be a layer, sheet, film or thin plate. However, with a body having a very small thickness, the effect may be principally through the ceramic.

Thus according to a first aspect of the present invention there is provided a body of fully dense metal oxide ceramic material which has been rendered electrically conductive through its thickness by the incorporation of silver into the material.

Preferably the ceramic material is alumina, but it may alternatively be, for example, chromia, or alumina-rich or chromia-rich ceramic.

Preferably the metal oxide ceramic material has a thickness of no more than 1 mm, more preferably no more than 10 μm.

In a preferred embodiment, the metal oxide ceramic material is a layer on a substrate. The substrate may be of any suitable material on which the layer can be provided. The layer of metal oxide ceramic material can be applied by any suitable means to the substrate, or it may be grown on the substrate, for example as in the case of a self-aluminising steel, that is a steel having an aluminium content of greater than 4.5 wt %.

In a solid oxide fuel cell the electrolyte, anode and cathode are normally ceramic materials. However, the surrounding structural components of a fuel cell stack may be of any material which can provide the required electrical conduction properties and structural strength to the stack assembly, at the temperatures necessary for operation of the fuel cell, for example in excess of 700° C. These components may be made of a ceramic or metal capable of handling the conditions. Some of these components, for example bipolar plates (also known as interconnect plates), are required to provide electrical connection between adjacent fuel cells. Sophisticated electrically conductive ceramics have been developed for this purpose but these materials are expensive, mechanically fragile and are poor thermal conductors when compared with many metals capable of handling the conditions.

The operating conditions in a solid oxide fuel cell are very severe on most metals, causing them to degrade via loss of mechanical strength, oxidation or other form of corrosion, distortion, erosion and/or creep. Various heat resistant metals have been developed to cope with many of these forms of degradation. Most such metals are alloys based on iron or nickel with substantial additions of chromium, silicon and/or aluminium, plus, in some alloys, more expensive elements such as cobalt, molybdenum and tungsten. Chromium based metals are also available.

The significant feature of all heat resistant steels is the oxide layer which is formed when the steel is exposed to mildly or strongly oxidizing conditions at elevated temperatures. They all form tight, adherent, dense oxide layers which prevent further oxidation of the underlying metal. These oxide layers are composed of chromium, aluminium or silicon oxides or some combination of these depending upon the composition of the steel. They are very effective in providing a built-in resistance to degradation of the underlying steel in high temperature oxidizing conditions.

However, while this feature is used to great advantage in many applications, the presence of the oxide layer is highly deleterious to the use of these steels in key components of solid oxide fuel cells. These oxides, especially those of silicon and aluminium, are electrically insulating at all temperatures and this is a major problem for those fuel cell components which must act as electrical current connectors. For these heat resisting steel to be useful for electrical conducting components in fuel cells, it is imperative that the insulating effect of the oxide layer be alleviated at least in selected locations.

According to a second aspect of the invention, there is provided a component formed of steel having a surface layer of alumina, chromia or alumina-rich or chromia-rich fully dense ceramic, said layer having been rendered electrically conductive through its thickness by the incorporation of silver into the layer.

The ceramic layer protects the underlying metal from chemical interactions while the electrical conductivity provided by the silver allows it to provide electrical contact with the underlying metallic component.

The silver may be incorporated into the layer as the layer is formed on the steel or after the layer has been formed on the steel. Preferably, the layer is formed by surface oxidation of the steel, for example as in the case of a self-aluminising steel.

For fuel cell and other applications, an advantage of the present invention is that a material such as alumina which is universally renowned for its excellent thermal and electrically insulating properties, as well as its chemical inertness, can have one of these three properties reversed without impairing the other two. The invention can provide, with alumina, a material which is still an excellent refractory material and inert in nearly all environments, but which is electrically conductive at least in selected positions. This is of special significance for various connections required in fuel cell assemblies. The effect has been found to be durable over long periods of time and over the full temperature range required for solid oxide fuel cell operation. The invention has been used to advantage to convert otherwise highly insulating alumina coated metal bipolar plates to conducting plates which can be used to collect current from operating fuel cells. The conductivity can be used as a sole means of current collection or used as a safeguard/backup in case a prime current collector mechanism fails.

The mechanism by which the silver migrates into or occurs in the metal oxide ceramic is not fully understood at this time. However, it is believed that the electrical conductivity is provided by the silver extending along grain boundaries of ceramic material. Incorporating the silver into the ceramic material can be achieved by heating the silver-containing material in contact with the ceramic material or with a substrate on which the ceramic material is formed.

According to a third aspect of the invention there is provided a method of providing electrical conductivity through a body of fully dense metal oxide ceramic material including placing a silver-containing material into contact with the ceramic material and heating the ceramic and silver-containing materials in contact with each other to at least 750° C. such that silver migrates from said silver-containing material into said layer of metal oxide ceramic material and creates electrically conductive pathways through the ceramic material.

The atmosphere in which the method is performed does not appear to be important and is conveniently air. The method is conveniently performed at atmospheric pressure.

According to a fourth aspect of the invention there is provided a method of forming a steel component with a heat-resistant and electrically conductive surface layer, said method including selecting a steel which forms an alumina, chromia or alumina-rich or chromia-rich fully dense surface layer in oxidizing atmosphere, placing a silver-containing material in contact with the surface of the steel, heating the steel and silver-containing material to at least 750° C. in an oxidizing atmosphere to cause said surface layer to form on the steel and to cause silver from said silver-containing material to occur in and to create electrically conductive pathways through the layer.

Preferably the steel used in the method of the fourth aspect of the invention has an aluminium content of above 4.5 wt %.

Preferably, the heating step in the methods of the invention is to at least 800° C., more preferably at least 850° C., even more preferably at least 900° C. and most preferably at least 950° C. It is believed that while the effect of the silver imparting electrical conductivity to the metal oxide ceramic material will occur at 750° C., or even less, the rate of the effect occurring is very slow at this temperature and increases with increasing temperature. The effect occurs especially quickly when the silver is in a liquid state, The silver-containing material is preferably at least commercially pure silver, but it may be an alloy or otherwise contain selected impurities which are not severely detrimental to the effect of imparting electrical conductivity to a metal oxide ceramic material. Such impurities or alloying elements may include one or more of the noble metals, Sn, Cu and Ni.

The silver-containing material may be in sheet, mesh, paste or other appropriate form. The silver-containing material may be provided on a substrate of a type which is acceptable to the end result.

Embodiments of the invention will now be described, by way of example only, with reference to the Examples and to the accompanying drawings in which.

EXAMPLE 1

Figure 1:
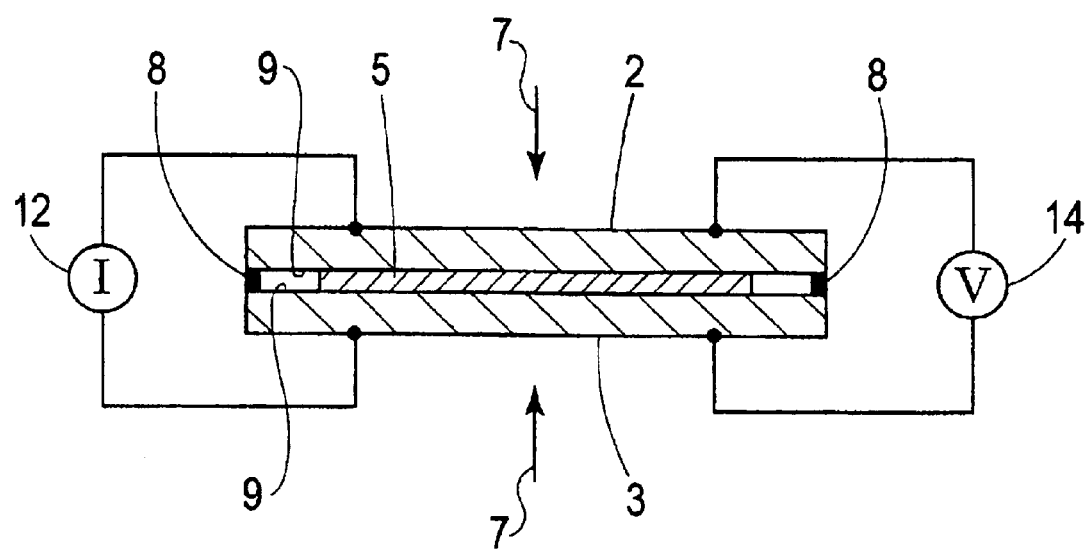
FIG. 1 is a diagrammatic representation of an experimental arrangement used to investigate the nature of the invention.

Referring to FIG. 1, two coupons 2 and 3 of clean, polished, heat resistant chromium-rich stainless steel approximately 1.0 cm square and 1 mm thick had sandwiched between them a square piece of silver foil 5 having a plan area of 0.864 $cm^2$. The sandwich structure was clamped together, as indicated by arrows 7, with a force of 6N. Seals 8 between the coupons, around their edge portions, were pliable at elevated temperature and took no significant load.

The facing surfaces 9 of the coupons 2 and 3 were maintained in an atmosphere of gently flowing dry air, facilitated by an array of straight parallel grooves (not shown) machined into the facing surfaces 9. The complete assembly was heated to 900° C. and maintained there for over 70 hours. A constant DC electric current of about 200 $mA/cm^2$ was maintained between the coupons 2 and 3 by means of a current generator 12 and the voltage across the coupons was measured by a meter 14. The material of seals 8 was an electrically insulating glass so the measured voltage indicated the change in resistance in the electrical path between the two coupons 2 and 3. The steel in the coupons had a composition of about 27% Cr, 0.05% C, 0.05% Al and 0.05% Si by weight so its heat resistance and chemical resistance properties derive from the formation of a thin chromia layer on the surface of the steel in the oxidizing atmosphere.

By the time the first reading was taken after heating to 900° C., a thin chromia layer had developed on the surfaces 9.

Figure 2:
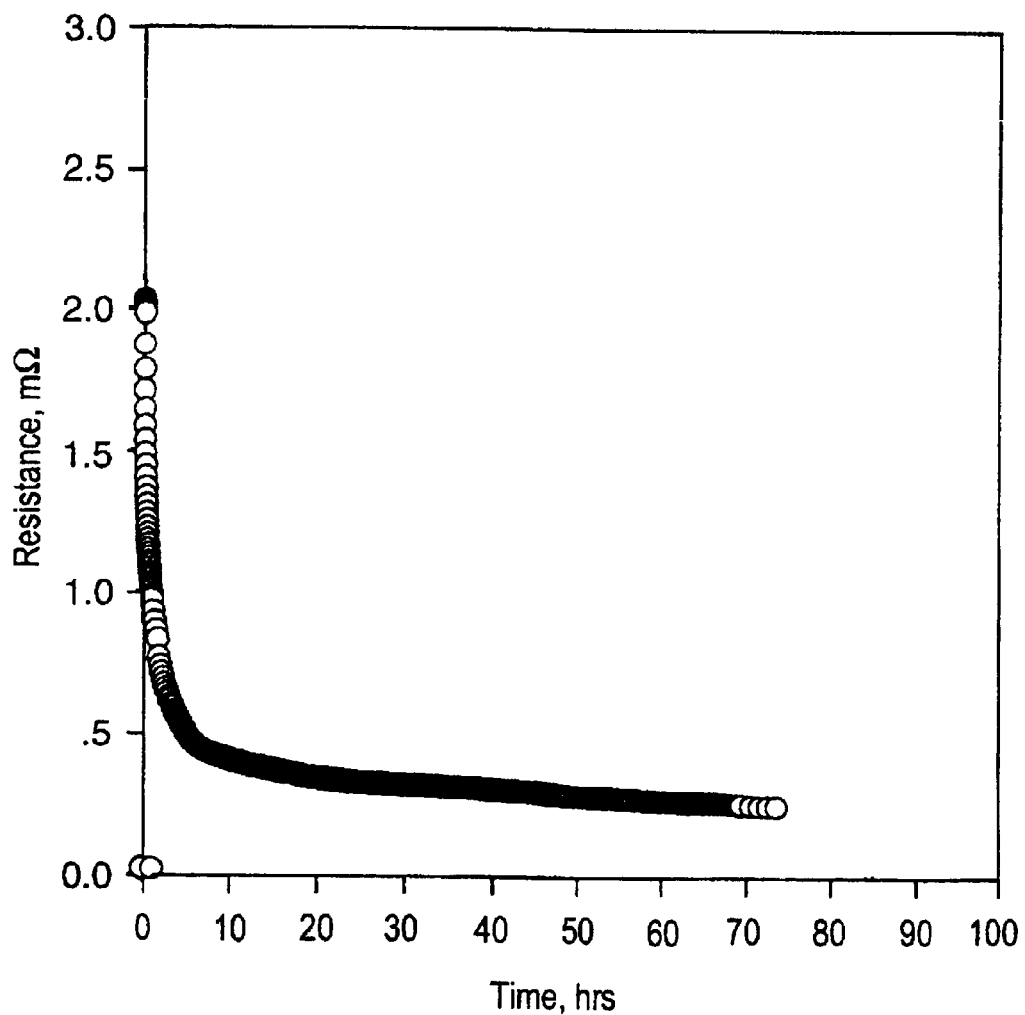
FIG. 2 is a plot of results recorded from an experiment of the form shown in FIG. 1.

As seen from FIG. 2, the resistance then dropped from 2 milliohm to 0.3 milliohm over 70 hours of operation. During this period it would have been expected that the resistance would increase due to thickening of the chromium oxide layer on the surfaces 9 of the coupons in contact with the silver foil. Removal and examination of the coupons revealed a chromia layer had been generated on the facing surfaces 9 but that the chromia was electrically conductive through its thickness where the silver had been in contact with it. It is believed that the silver penetrates the growing chromia layer and improves its conductivity. A similar result is achieved if the chromia layer is preformed on the stainless steel. If the same experiment were performed with a stainless steel foil instead of the silver foil, the chromia layer produced on the surfaces 9 would provide a resistance in the range of thousands of ohms per square centimeter instead of the thousandths of ohms per square centimeter found using the silver foil.

EXAMPLE 2

Figure 3:
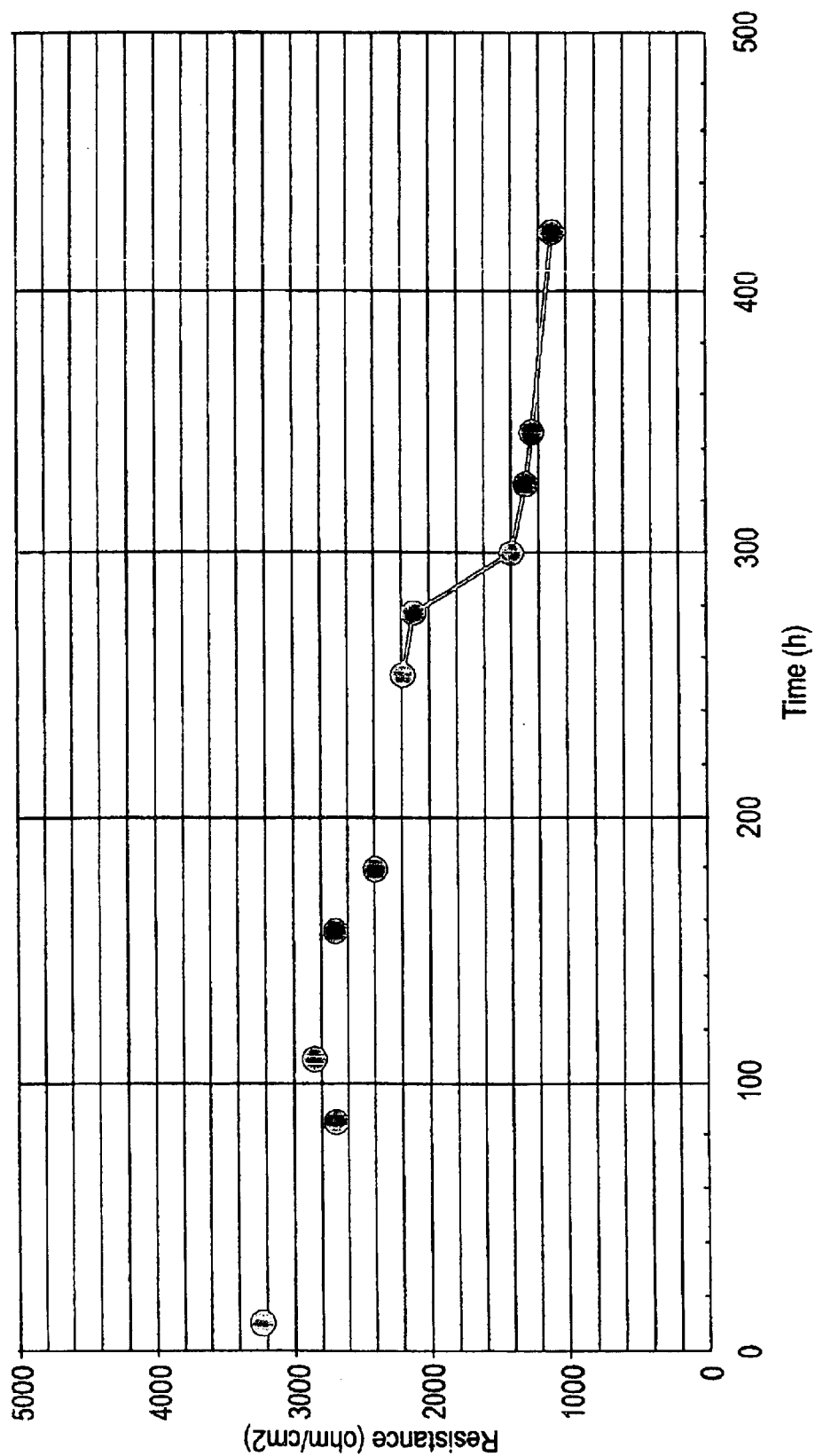
FIG. 3 is a plot of results recorded from a variant of the experiment shown in FIG. 1.

In a further experiment using a similar apparatus to that of Example 1, the coupons used were similar to those described above, but of a stainless steel which produces an alumina protective coating when heated. Such stainless steels are known as self-aluminising and have an Al content of greater than 4.5 wt %. These were heated at 1025° C. in air for 1 hour to produce a coating of tightly adhered alumina approximately 1 to 2 $\mu$m thick on the exposed surface. The alumina coating was electrically insulating, with a resistance in excess of 3000 $ohm/cm^2$ (measured to a clean polished surface at the rear face). The coupons were then assembled as shown in FIG. 1, with the alumina-coated surfaces facing each other and with silver mesh taking the place of foil 5, and held in air at 850° C. The mesh was made from silver wire of about 50 $\mu$m diameter woven at about 120 $\mu$m centres. The results are shown in FIG. 3. After 420 hours the resistance across the sandwich had dropped to about one third of its starting value and was continuing to reduce. The 1 to 2 μm thick tightly adherent layer of alumina had become electrically less resistive at the places where the silver mesh was in contact with it. A similar result is achieved if the alumina layer is formed after the silver material has been placed in contact with the stainless steel.

EXAMPLE 3

It has been found that is it not necessary for the foil or mesh used to be of solid silver. When an expanded metal mesh made from stainless steel and electrocoated with silver was substituted for the solid silver mesh used in Example 2, the resistance of the alumina layer reduced in the same manner. It therefore appears that only small quantities of silver are required to be transferred to the alumina in order for the electrical conductivity effect to occur.

EXAMPLE 4

In a further variation of Example 2, a small quantity of silver paste was substituted for the silver mesh. The clamped coupons were then exposed to an air atmosphere at approximately 950° C. The resistance was observed to drop at a much faster rate than with the silver mesh at 850° C.

EXAMPLE 5

In a further variation of Example 2, the surfaces of the stainless steel coupons were polished to remove any oxide coating and the silver paste of Example 4 was applied between the polished surfaces of the coupons before any heating. The coupons were then heated in air at temperatures from 800° C. to 970° C. Although an alumina coating quickly established itself on the surface of the steel, its resistance remained less than 10 milliohm/cm$^2$. The coating remained conductive when the temperature was reduced to ambient and through many such heating and cooling cycles. The silver and silver paste is quite pervious to oxygen, so the alumina layer is not prevented from developing on the surface of the steel, but it does develop with a low electrical resistivity.

The behaviour of the chromia and alumina in the way described was surprising. The noble metals, including silver, have been used to bond bulk alumina components together, but electrical conduction was not the aim, nor has it been reported as an outcome. The structure of the conductive chromia and alumina has not yet been properly determined, nor has the mechanism by which the silver produces the conductivity in the oxide. While not intending to be bound by any theory, it is thought that when heated, small amounts of the silver are drawn threadlike along grain boundaries in the oxide and create an open mesh arrangement of silver threads or strands within the alumina such that there is eventually created a continuous path of silver along the grain boundaries through the full thickness of the layer of oxide.

Much effort has been spent developing heat resistant steels for bipolar plates for solid oxide fuel cells. Self-aluminising steels have particular advantages at the high operating temperatures required. If the coated surface is damaged in some way, it becomes self healing as aluminium in the steel diffuses to the exposed surface where it oxidises to form a new protective coating of alumina. The alumina coating also has the beneficial property of totally blocking any escape of chromium from the steel. This is important because even small traces of chromium-based gases in an atmosphere will quickly and permanently reduce the performance of a solid oxide fuel cell. However the great benefits of self-aluminising steels have often been forgone because of the need to have the surface of the plate function as an electrical current collector, and this has been incompatible with alumina's properties as an electrical insulator. Thus the emphasis has been to develop steels which do not produce an alumina-rich layer upon their surface when exposed to oxidizing atmospheres at high temperatures. In contrast, the present invention means that the benefits of an alumina coating may be obtained without the disadvantage of its high electrical resistance.

In addition to bipolar plates, the invention may be used for other components of fuel cells, particularly solid oxide fuel cells, such as current collector straps and beat exchangers.

Fuel cell components, and bipolar plates in particular, made in accordance with the second aspect of the invention with an alumina or alumina-rich layer may be superior to those obtainable with other heat resistant materials currently available in one or more of the following properties:

1) stronger and tougher: steels exhibit good strength and fracture resistance at the operating temperature of the fuel cell and during the warm up and cool down phases;

2) cost: the cost of fuel cell components in accordance with the invention is less than other materials which have been used for interconnect plates in solid oxide fuel cells, e.g. Ni alloys, austenitic stainless steels, chromium alloys and ceramics;

3) oxidation resistance: the components have an excellent, inherent resistance to surface degradation at temperatures within the range 500° C. to 950° C. in the atmospheres usually present in a solid oxide fuel cell, viz moist air, moist hydrogen, moist hydrocarbons and oxides of carbon; and 4) electrical conductivity: the alumina or alumina-rich layer is electrically conductive from its exposed surface through to the underlying metal, thus providing a direct pathway for electrical contact and current flow through the component.

It is probable that in addition to its use with fuel cells, the invention has advantages in many areas of technology where insulating and conducting elements are used in close proximity and/or stable electrical properties at elevated temperatures are required. Technologies such as thick and thin film printed circuit boards, microelectronics, semiconductors, wave guides and sensors could benefit from the invention. There are many potential uses for alumina or chromia which is electrically conductive either in total or in selected areas.

Those skilled in the art will appreciate that the invention described herein is susceptible to variations and modifications other than those specifically described. It is to be understood that the invention includes all such variations and modifications which fall within its spirit and scope.

What is claimed is:

1. A component formed of steel having a surface layer of alumina, chromia or alumina-rich or chromia-rich fully dense ceramic, said layer having been rendered electrically conductive through its thickness by the incorporation of silver into the layer.

2. A component according to claim 1 wherein said thickness is no more than 1 mm.

3. A component according to claim 2 wherein said thickness is no more than 10 μm.

4. A component according to claim 1 wherein the silver extends along grain boundaries of the ceramic.

5. A component according to claim 1 wherein the silver has been incorporated into the layer after the layer has been formed on the steel.

6. A component according to claim 1 wherein the layer has been formed by surface oxidation of the steel.

7. A component according to claim 1 which is a component for a fuel cell assembly.

8. A component according to claim 7 which is a bipolar plate.

9. A method of forming a steel component with a heat-resistant and electrically conductive surface layer, said method including selecting a steel which forms an alumina, chromia or alumina-rich or chromia-rich fully dense surface layer in oxidizing atmosphere, placing a silver-containing material in contact with the surface of the steel, heating the steel and silver-containing material to at least 750° C. in an oxidizing atmosphere to cause said surface layer to form on the steel and to cause silver from said silver-containing material to occur in and create electrically conductive pathways through the layer.

10. A method according to claim 9 wherein the silver-containing material is an alloy of silver.

11. A method according to claim 9 wherein the steel has an aluminum content of above 4.5 wt %.

12. A method according to claim 9 wherein the silver-containing material is at least commercially pure silver.

13. A method according to claim 9 wherein the silver-containing material is in the form of a sheet, a mesh or a paste.

14. A method according to claim 9 wherein said heating is to at least 800° C.

15. A method according to claim 9 wherein said heating is to at least 850° C.

16. A method according to claim 9 wherein said heating is to at least 900° C.

17. A method according to claim 9 wherein said heating is to at least 950° C.

* * * * *